United States Patent [19]
Jarva

[11] 4,281,325
[45] Jul. 28, 1981

[54] POSITIVE FEEDBACK METER PULSE INITIATOR

[75] Inventor: Curt W. Jarva, Jamaica Plain, Mass.

[73] Assignee: American Science and Engineering, Inc., Cambridge, Mass.

[21] Appl. No.: 67,263

[22] Filed: Aug. 17, 1979

[51] Int. Cl.³ .................. G08C 19/36; G08C 19/16
[52] U.S. Cl. .......................... 340/870.29; 250/205;
250/231 SE; 340/870.02; 340/870.42
[58] Field of Search ............. 340/190, 201 P, 189 R,
340/189 M, 186, 347 P, 203; 250/231SE, 205;
455/613, 606, 608; 356/141, 152; 307/117, 351,
354, 364; 33/363 K; 315/150, 151, 158

[56] References Cited
U.S. PATENT DOCUMENTS

| 3,542,479 | 11/1970 | Sibalis | 250/205 |
| 3,631,250 | 12/1971 | Van Buskirk | 250/205 |
| 3,725,665 | 4/1973 | Talmo | 250/231 SE |
| 3,755,687 | 8/1973 | Garnett | 250/205 |
| 3,846,788 | 11/1974 | Calabro et al. | 340/190 |
| 3,944,813 | 3/1976 | Fowler | 250/231 SE |
| 4,086,580 | 4/1978 | Schroeder | 340/190 |

Primary Examiner—James J. Groody
Attorney, Agent, or Firm—Pollock, Vande Sande & Priddy

[57] ABSTRACT

A meter pulse initiator is employed to generate signals corresponding to the rotation of the rotor of a watthour meter. Infrared light emitting diodes (IREDs) receive a small steady state driving current and radiate two low intensity beams of radiation that are reflected from the surface of a rotating rotor. A creep hole in the rotor passes beneath one of the beams and transmits the low intensity radiation to an associated phototransistor. A small current is induced in the phototransistor and the current is amplified by a Darlington amplifier. The amplified current is applied to the IRED to increase the intensity of the radiation of the IRED in a positive feedback loop. Component saturation defines a peak driving current and an associated peak radiation intensity for the IRED. As the phototransistor current increases, a capacitor is charged to a threshold voltage and after the creep hole passes the IRED/phototransistor pair, the capacitor discharges. The charge/discharge cycle of the capacitor is detected by a Schmitt trigger that generates a corresponding signal to set a flip-flop. When the creep hole passes beneath the second radiation beam a second signal is generated and is applied to reset the flipflop.

7 Claims, 4 Drawing Figures

POSITIVE FEEDBACK METER PULSE INITIATOR

BACKGROUND OF THE INVENTION

The invention relates to a meter pulse initiator and, more particularly, to such a pulse initiator that generates electrical signals corresponding to the rotation of the rotor of a watthour meter.

Electrical utilities typically use watthour meters to measure energy usage at remote consumer locations. Such meters generally operate to rotate a rotor disc at a speed that is proportional to the power usage at the particular romote location. The rotational movement of the rotor disc is coupled to an indicator dial that registers the power usage and the indicator dial is periodically read by a representative of the utility to determine the power consumption at the consumer location.

Such a meter reading process is time consuming and relatively wasteful of manpower since many human meter readers must be employed to service the large number of watthour meters that are installed throughout a power distribution network. In addition, the delays and human error inherent in such a meter monitoring system add to the system's overall inefficiency. Furthermore, such systems are subject to consumer tampering since individual meters are only cursorily inspected at periodic intervals.

Consequently, automatic watthour meter monitoring systems have been devised to constantly monitor the various watthour meters in a network and to thereby increase the efficiency of the monitoring system. Such systems have employed meter pulse initiators for converting the rotary motion of the rotor of a watthour meter to corresponding electrical signals that are transmitted to a central monitoring location.

The U.S. patent to Roe, U.S. Pat. No. 3,127,594, discloses a prior art meter pulse initiator that uses a continuous light source to irradiate the reflecting surface of the rotating rotor of a watthour meter. A phototransistor is employed to detect the light that is reflected from the surface of the rotor. As the rotor rotates, non-reflective marks on the rotor interrupt the radiation from the light source. The phototransistor registers the interruptions of the light and thereby provides electrical signals that correspond to the rotation of the rotor. Other prior art meter pulse initiators employ a hole, commonly called a creep hole, in the rotor to transmit light from a source on one side of the rotor to a detector on the other side of the rotor.

Prior art meter pulse initiators have typically employed continuously energized, high intensity light sources that utilize a substantial amount of power. In addition, the continuous, high intensity operation of such sources has resulted in operational degradation over time, causing increased susceptibility to noise-related errors.

Also, many of such pulse initiators have reduced reliability due to the effects of ambient light, thermal current errors inherent in such devices as phototransistors, and measurement errors induced by rotor vibration or reference jitter.

Moreover, many prior art meter pulse initiators are susceptible to willful tampering by the use of bright lights such as flood lamps or pulsed lights such as strobe lamps, as well as unintentional jamming by sunlight and sources of artificial illumination.

Accordingly, it is an object of the invention to provide a simple and effective means to fit a watthour meter with an optical meter pulse initiator that provides an electrical signal output that is proportional to power useage.

A further object of the invention is to provide such a meter pulse initiator that will operate with a light signal of greater intensity to reduce the effect of ambient illumination.

Another object of the invention is to provide a positive indication of the rotation of the rotor of a meter despite rotor vibration or reference jitter.

A further object of the invention is to provide a meter pulse initiator having a radiation source that normally operates at reduced power to save energy and that operates at increased power levels to provide intense radiation when a creep hole moves between the radiation source and an associated radiation detector.

These and other objects of this invention will become apparent from a review of the detailed specification which follows and a consideration of the accompanying drawings.

BRIEF SUMMARY OF THE INVENTION

In order to achieve the objects of the invention and to overcome the problems of the prior art, the meter pulse initiator, according to the invention comprises a device which can be mounted adjacent the edge of the rotor, in overlying relation to the opposing surfaces of the rotor to provide electrical pulses corresponding to the accumulation of energy on the meter as the rotor rotates. The device includes infrared light emitting diodes (IREDs) or other types of radiation emitting diodes which are positioned on one side of the rotor of the watt-hour meter for generating two spaced beams of low intensity radiation which are directed toward the rotor of the meter. As the rotor rotates, each of the low intensity beams is interrupted by the surface of the rotor until an optical feature, for example a creep hole (normally present in the rotor of a watt-hour meter, for use in calibration), passes the light energy of a beam to an associated phototransistor which forms a portion of the device disposed on the opposite side of the rotor.

As the creep hole passes through the area defined by the first low intensity beam, a small current is induced in the associated phototransistor and the current is amplified by a Darlington amplifier. The amplified current is fed back to the IRED to increase the intensity of the radiation of the IRED in a positive feedback loop. Component saturation defines a peak driving current and an associated peak radiation intensity for the IRED.

As the phototransistor current increases, a capacitor is charged to a threshold voltage and after the creep hole passes the optical path of the first beam the capacitor discharges. The charge/discharge cycle of the capacitor is detected by a Schmitt trigger that generates a corresponding signal to set a flipflop.

When the creep hole passes through the second radiation beam a second signal is generated to reset the flipflop and thereby provide a positive indication of the rotation of the rotor.

DETAILED DESCRIPTION OF PREFERRED EMBODIMENTS

Figure 1:
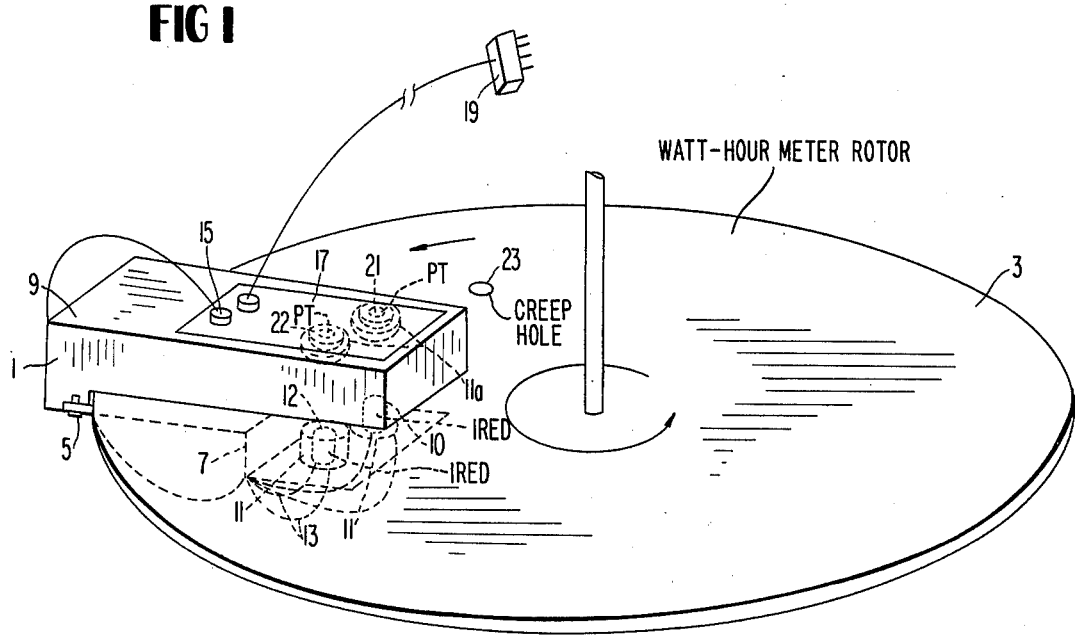
FIG. 1 illustrates a pictorial representation of a meter pulse initiator in accordance with the invention.

The remaining portion of this specification will describe preferred embodiments of the invention when read in conjunction with the attached drawings, in which like reference characters identify identical apparatus.

Figure 2:
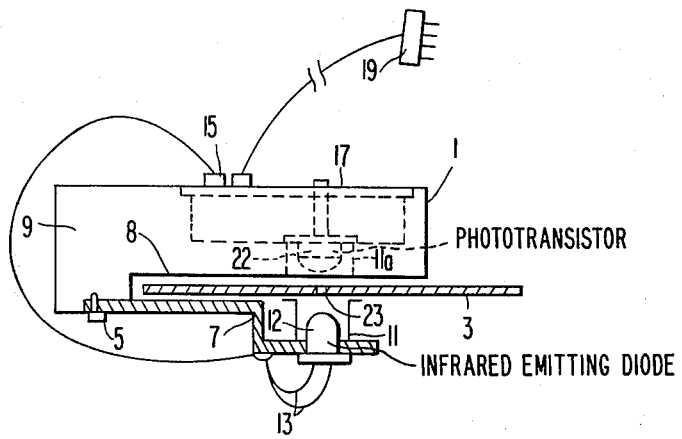
FIG. 2 illustrates a side view of the meter pulse initiator assembly of FIG. 1.

FIGS. 1 and 2 illustrate a two-channel meter pulse initiator in accordance with the invention. More particularly, an optical assembly 1 is arranged to fit over the rotor 3 of a watthour meter. Machine screws 5 may be used to secure a lower assembly portion 7 of the optical assembly 1 to an upper assembly 9. Radiation sources 10 and 12, for example, infrared emitting diodes (IREDs) such as commercially available diodes designated OP 133, may be supported by the lower assembly 7 in a spaced relation to the rotor disc 3. Each of the IREDs is enclosed by a light shield 11 to block ambient light. Two power leads 13 connect the series connected IREDs 10 and 12 to power terminals 15 disposed on a printed circuit board 17.

The printed circuit board 17 fits into a recessed edge around the top of the upper assembly 9 and is used to support the circuit components and provide the circuit interconnections for the circuitry of the invention. A cable and connector 19 supply power to the circuit board and carry the output signals that are generated by the circuitry of the invention.

Two phototransistors 21 and 22, for example commercially available phototransistors designated fp 520A, are mounted in the upper assembly 9 and the emitter and collector leads of the phototransistors are brought up to the printed circuit board 17 for connection with the circuitry of the invention. The base leads of the phototransistors may be cut off at the device to minimize collector-base capacitance and to thereby maximize the response time of the phototransistors. In addition, light shields 11a may be used to surround each phototransistor 21 and 22 to block the entrance of ambient light. Both sides of the printed circuit board may be coated with a suitable protective material, for example Dow Corning 3140, to protect the circuitry from ambient conditions.

In operation, a watthour meter registers energy usage by causing a rotor 3 to rotate at a speed that is proportional to the use of power. The apparatus of the invention operates to optically detect the rotation of the rotor 3 and to generate corresponding electrical pulses that may be used to count the number of rotations of the rotor 3 and to thereby indicate the energy reading of the meter.

Figure 3:
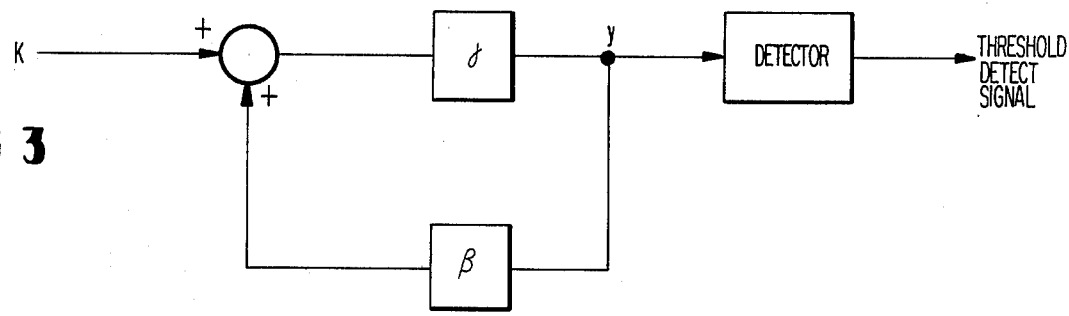
FIG. 3 illustrates a block diagram of a positive feedback system in accordance with the invention.

The operation of a meter pulse initiator in accordance with the invention may be better understood by reference to FIG. 3 which illustrates a block diagram of a positive feedback system for detecting the rotation of the rotor 3. More particularly, as the rotor 3 rotates, the IREDs 10 and 12 receive a small constant current K that causes the IREDs 10 and 12 to irradiate the surface of the rotor 3 with relatively low intensity infrared radiation. While the IREDs and associated phototransistors are separated by the body of the rotor 3, the transfer gain $\gamma$ between each IRED/phototransistor pair is very small.

However, when a creep hole in the rotor 3 moves between an IRED and its associated phototransistor, the low intensity infrared radiation from the IRED passes through the creep hole and irradiates the phototransistor, thereby resulting in an increase in the transfer gain $\gamma$ by several orders of magnitude.

The low intensity radiation from the IRED induces a small current y in the irradiated phototransistor. The small current is amplified by a feedback gain factor $\beta$ and the amplified current is applied to the IRED in a positive feedback loop to cause the IRED to radiate more strongly. The increased radiation from the IRED passes through the moving creep hole and induces a greater current in the associated phototransistor, according to the relation: $y = (\gamma/1-B\gamma) \cdot (K)$.

The increased current in the phototransistor is amplified and the corresponding increased amplified current is applied to increase still further the radiation intensity of the IRED. The positive feedback process continues until a component saturation level is reached at a corresponding high IRED driving current.

During the positive feedback process, phototransistor current y charges a capacitor to a threshold voltage that may be detected by a suitable threshold detector and a corresponding detect signal may be generated to indicate that the creep hole 23 has passed between an IRED/phototransistor pair.

It should be understood that, in accordance with the feedback system of the invention, when the product $\beta\gamma$ is larger than 1, the system of FIG. 3 becomes unstable and the output y increases until the Darlington is saturated. Thus, for proper operation of the feedback system of FIG. 3, the gain $\beta$ must be sufficiently large to ensure that the product $\beta\gamma$ is greater than one when a creep hole is positioned between an IRED and a phototransistor and less than one when the rotor separates the IRED and phototransistor.

It should be appreciated that the positive feedback system of the invention provides an unambiguous registration of the rotation of the rotor 3 with a corresponding minimum utilization of power, since the IREDs are normally operated at a small steady state current. The driving current of an IRED is only momentarily increased when a creep hole passes between thw IRED and its associated phototransistor.

Figure 4:
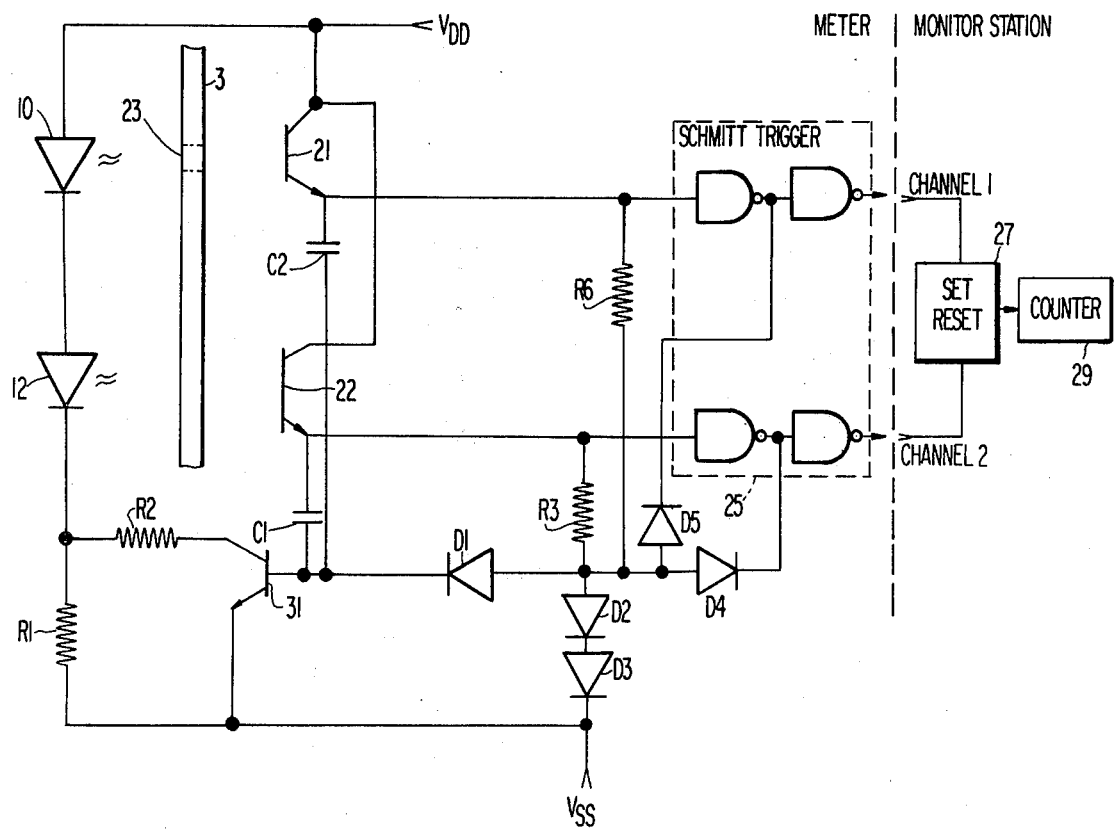
FIG. 4 illustrates a circuit diagram of a pulse generating and counting circuit for a preferred embodiment of the invention.

FIG. 4 illustrates a circuit diagram of a pulse generating and counting circuit for a preferred embodiment of the invention. As shown in FIG. 4, a meter pulse generation circuit is disposed at a meter location to generate electrical pulse corresponding to the rotation of a rotor 3 of a watthour meter, and associated counting circuitry, including a flipflop 27 and a counter 29, is provided at a remote meter monitoring location to receive and count the electrical pulses. However, it should be appreciated that the flipflop 27 may alternatively be placed at the meter location.

A two channel pulse generating circuit is utilized in a preferred embodiment of the invention in order to unambiguously detect the movement of the creep hole. More particularly, two spacially separated IRED/phototransistor pairs are employed to generate two count signals for each revolution of the rotor 3. One of the count signals, for example the channel one signal, is applied to set the flipflop 27 and the other count signal, for example the channel two signal, is applied to reset the flipflop. Thus, a single pulse is generated at the output of the flipflop for each rotation of the rotor 3 and the flipflop output pulse is applied to increment the counter 29 to record a rotation count that corresponds to the energy reading of the remote meter.

It should be understood that the two channel pulse generation circuit avoids counting errors if multiple count pulses are generated in either channel. For example, if the edge of a creep hole stops in the optical path of an IRED and associated phototransistor and vibration causes the hole to move into and out of the optical path, many count pulses will be generated. However, since the multiple count pulses drive either a set or a reset input of the flipflop 27, the state of the flipflop will not change after the first of the multiple pulses is received. Thereafter, when the hole moves to the next IRED/phototransistor position, the state of the flipflop will be changed by the associated count pulse from the new channel.

Thus, two IRED/phototransistor pairs are used to provide a negative indication that the creep hole 23 has rotated through the radial position defined by the first IRED 10 and the phototransistor 21 to a second radial position defined by the second IRED 12 and the phototransistor 22. Of course, it should be understood that the IRED/phototransistor pairs are spaced so that the creep hole 23 is completely outside of the light path of the first pair before it enters the light path of the second pair.

Furthermore, it should be appreciated that more than one creep hole or more IRED/phototransistor pairs may be used to indicate the rotational condition of the rotor 3. For example, some watthour meter rotors have two calibration creep holes located 180° apart. Such holes may be used in conjunction with the apparatus of the invention to indicate half revolutions of the rotor 3. In general, for n holes in the rotor, all at the same distance from the center of the rotor, the number of rotor rotations equals the number of pulse counts divided by n.

As shown in FIG. 4, as the creep hole 23 passes between IRED 10 and the associated phototransistor 21, infrared radiation is emitted from the IRED 10 due to the current that passes from $V_{DD}$ through IRED 10, IRED 12, and $R_1$ to $V_{SS}$. The radiation impinges upon the phototransistor 21 and induces a current through a collector emitter junction of the phototransistor. The induced current is proportional to the corresponding driving current for the IRED and most of the induced current flows through a capacitor C2 and then through the base emitter junction of a Darlington amplifier 31, for example a type MPSA12 or TIS150. The base current turns on the Darlington amplifier 31 which begins pulling current through R2 and the IREDs 10 and 12. The increased current through the IRED 10 increases the radiation intensity of the IRED, thereby increasing the current that is generated by the phototransistor 21. Thus, a positive feedback loop is created and the Darlington amplifier is soon saturated at a relatively high IRED driving current.

The IRED driving currnt continues to flow until the capacitor C2 charges to a voltage corresponding to the level at which the phototransistor current equals the current through a resistor R6. The charged capacitor C2 acts to shut off the flow of base current into the Darlington base emitter junction, thereby causing the IRED current to drop back to a small steady state value and the IRED to generate a corresponding low intensity infrared radiation. Thereafter, the induced current in the phototransistor 21 drops and the capacitor C2 begins discharging through the resistor R6 and a forward biased diode D1, diodes D2 and D3 being reverse biased.

Thus, even if a creep hole stops between an IRED and an associated phototransistor, the circuit will operate to generate a brief positive feedback current pulse and, thereafter, the associated charged capacitor will block the flow of current to the base emitter of the Darlington amplifier and will thereby reduce the driving current of the IRED to its normal small steady state value.

When the capacitor C2 is charging, the increasing voltage of the capacitor is applied to the input of a threshold detector 25, for example a Schmitt trigger having a commercial designation 4093. The Schmitt trigger generates a positive output pulse when the voltage on the capacitor C2 reaches a positive threshold value. The output pulse remains high until C2 discharges to a voltage that is below the negative threshold of the Schmitt trigger. As explained above, the output pulse for the first channel is applied to set a flipflop 27 in the monitoring station. In addition, the Schmitt trigger 25, while its output is high, provides a reduced bias voltage for the Darlington 31 by clamping the voltage at the anode of D2 through D5. This prevents the Darlington 31 from continually firing in response to low level noise currents through C2 if the creep hole has stopped between the IRED and phototransistor.

It should be understood that good noise rejection is achieved in the apparatus of the invention by utilizing a capacitor and threshold detector to define a relatively high energy threshold. Thus, the apparatus of the invention is less sensitive to background noise caused by ambient light, dark current, pulsed light or induced electrical signals.

Although the operation of the components of one channel of the circuit of FIG. 4 has been described, it should be understood that the operation of the components comprising the second channel, for example the IRED 12, phototransistor 22, capacitor C1 and diode D4 is essentially the same. More particularly, when the creep hole 23 moves between the IRED 12 and the phototransistor 22, a positive feedback loop is established and, therefore, while C2 is still discharging, the capacitor C1 begins to charge through the Darlington 31 since the Darlington provides the only current path to $V_{SS}$.

It should be understood that while the capacitor C2 is discharging, the diodes D2 and D3 are reverse biased so that current cannot drain off through the resistor R3. Of course, after C1 begins to charge, the diodes D2 and D3 are forward biased.

As the Darlington 31 turns on to establish the feedback loop for the second channel, the diode D1 is reverse biased and, therefore, the capacitor C2 momentarily ceases to discharge until after the Darlington is on. When the Darlington is on, the small remaining charge on the capacitor C2 discharges through the base emitter junction of the Darlington.

As explained previously, the voltage that is generated during the charge/discharge cycle of the capacitor C1 causes a Schmitt trigger to generate a corresponding second channel output pulse that is applied to reset a flipflop in the monitoring station.

It should be appreciated that the operational values and commercial designations of the components of the circuit of FIG. 4 may be changed without departing from the spirit of the invention. However, for a preferred embodiment of the invention, it has been determined that a reasonable small steady state IRED driving current of 10 MA may be provided if the resistor R1 is of a type generally designated 910R. Moreover, if a current limiting resistor R2 of a type designated 22R is employed, the maximum current through the IREDs may be defined at a safe 400 MA when the Darlington 31 is on.

For a preferred embodiment of the invention, the resistor R3 may have a value of 3.3 K ohms in order to provide an adequate current discharge path for the capacitor C1 and a steady state noise current drain path that will ensure that C1 does not gradually charge and give a false signal. The resistor R6 may have the same value to provide the same current drain functions for the capacitor C2.

The capacitors C1 and C2 may have values of 2.2 μfd in order to ensure that the capacitors charge to a sufficiently high threshold voltage, for example six volts, to aid in noise discrimination.

The diodes D1, D2, D3, D4 and D5 may be of a type designated IN 4148. The diode D1 provides a discharge path for both C1 and C2 and also provides a means for one capacitor to establish a feedback path while the other capacitor is discharging.

The diodes D2 and D3 provide biasing for the Darlington to keep it near its threshold level for low level operation and the diode D1 prevents the Darlington from turning on due to the biasing of the diodes D2 and D3. The diodes D2 and D3 also provide a current path to $V_{SS}$ for current that is drained through the resistors R3 and R6. The diodes D4 and D5 lower the biasing of the Darlington after the Schmitt trigger produces an output pulse to prevent noise from causing repetitive Darlington firing.

Although the operation of the meter pulse initiator of the invention has been described with respect to a watthour meter, it should be understood that the invention may be used for any application wherein a rotary or other relative physical motion between a radiation source and an irradiated object can be optically differentiated.

Also, it should be understood that an optical feature other than a hole may be used to define a point on the rotor for passing radiation from a radiation source to an associated phototransistor. For example, a reflective spot may be employed to reflect the radiation from the source to the phototransistor. In addition, it should be understood that other means for generating source radiation, for example a visible light emitting diode, may be employed without departing from the spirit of the invention.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. A meter pulse initiator for use with a watthour meter of the type comprising a rotor disc having at least one creep hole therein, said meter pulse initiator comprising at least one light emitting diode disposed adjacent said rotor disc for directing at least one beam of radiant energy toward one side of said disc along the path of rotary movement of said creep hole to effect a transmission of said radiant energy through said rotor disc when said creep hole passes through said beam, at least one phototransistor disposed adjacent said rotor disc for producing a signal in response to the transmission of radiant energy through said creep hole to the other side of said rotor disc, the magnitude of the signal provided by said phototransistor being related to the intensity level of the radiant energy which is transmitted through said creep hole, a first energizing circuit connected to said light emitting diode and operable to cause said light emitting diode normally to emit radiant energy at a comparatively low intensity level, and a normally inactive second energizing circuit connected to said light emitting diode and operable, when activated, to supply a comparatively brief current pulse to said light emitting diode in supplementation of the energization supplied to said light emitting diode by said first energizing circuit thereby to cause a comparatively brief increase in the intensity level of the radiant energy which is emitted by said light emitting diode, said second energizing circuit including control means responsive to the comparatively small magnitude of signal provided by said phototransistor as a result of the passage of radiant energy at said comparatively low intensity level through said creep hole for activating said second energizing circuit and subsequently operable, in response to the resulting increased magnitude of signal produced by said phototransistor, to deactivate said second energizing circuit, whereby the transmission of radiant energy at said comparatively low intensity level through said creep hole effects a pulse-like increase in the intensity level of the radiant energy which is emitted by said light emitting diode followed by a return of said light emitting diode to its normal comparatively low intensity level of emission and a resulting pulse-like increase and decrease in the magnitude of the signal produced by said phototransistor, notwithstanding the continued passage of radiant energy through said creep hole.

2. The meter pulse initiator of claim 1 including counting means coupled to said phototransistor for counting the pulse-like signal outputs of said phototransistor.

3. The meter pulse initiator of claim 2 wherein said counting means comprises a Schmitt trigger circuit connected to said phototransistor, and a flip-flop connected to the output of said trigger circuit.

4. The meter pulse initiator of claim 3 including a further light emitting diode disposed adjacent one side of said rotor disc and an associated further phototransistor disposed adjacent the other side of said disc, said further light emitting diode and further phototransistor each being positionally displaced from said first mentioned light emitting diode and phototransistor respectively relative to the path of movement of said creep hole, circuit means for causing said further phototransistor to produce a pulse-like output signal when said creep hole passes through the beam of radiant energy emitted by said further light emitting diode, and means connecting said further phototransistor to said Schmitt trigger circuit, the production of a pulse-like output signal by one of said phototransistors being operative to set said flip-flop and the production of a pulse-like output signal by the other of said phototransistors being operative to reset said flip-flop.

5. The meter pulse initiator of claim 1 wherein said light emitting diode is operative to emit infrared light.

6. The meter pulse initiator of claim 1 wherein said normally inactive second energizing circuit comprises a transistor amplifier whose output is connected to said light emitting diode, said control means comprising capacitor means for capacitively coupling the signal at the output of said phototransistor to the input of said transistor amplifier.

7. The meter pulse initiator of claim 6 wherein said control means further includes a discharge circuit connected to said capacitor means for discharging said capacitor means when the charge in said capacitor means reached a predetermined value.

* * * * *